United States Patent
Park

(10) Patent No.: US 8,035,121 B2
(45) Date of Patent: Oct. 11, 2011

(54) PACKAGE FOR LIGHT EMITTING DEVICE HAVING A LENS SPACED FROM A LIGHT EMITTING DEVICE MODULE

(75) Inventor: Jun Seok Park, Kwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 974 days.

(21) Appl. No.: 11/719,701

(22) PCT Filed: Dec. 31, 2004

(86) PCT No.: PCT/KR2004/003565
§ 371 (c)(1),
(2), (4) Date: May 18, 2007

(87) PCT Pub. No.: WO2006/064996
PCT Pub. Date: Jun. 22, 2006

(65) Prior Publication Data
US 2009/0146158 A1 Jun. 11, 2009

(30) Foreign Application Priority Data
Dec. 17, 2004 (KR) .................. 10-2004-0107783

(51) Int. Cl.
*H01L 29/22* (2006.01)
(52) U.S. Cl. .................................. 257/98; 257/99
(58) Field of Classification Search .......... 257/84, 257/88, 89, 98, 99, E33.001, E33.068
See application file for complete search history.

(56) References Cited

U.S. PATENT DOCUMENTS

| | | | |
|---|---|---|---|
| 3,875,456 A * | 4/1975 | Kano et al. | 313/501 |
| 6,274,890 B1 | 8/2001 | Oshio et al. | |
| 6,719,436 B1 * | 4/2004 | Lin et al. | 362/612 |
| 7,126,162 B2 * | 10/2006 | Reeh et al. | 257/98 |
| 7,259,403 B2 * | 8/2007 | Shimizu et al. | 257/99 |
| 2002/0141006 A1* | 10/2002 | Pocius et al. | 359/15 |
| 2004/0056260 A1* | 3/2004 | Slater et al. | 257/79 |
| 2004/0070338 A1 | 4/2004 | Noguchi et al. | |
| 2005/0221518 A1* | 10/2005 | Andrews et al. | 438/27 |
| 2006/0097385 A1* | 5/2006 | Negley | 257/722 |

FOREIGN PATENT DOCUMENTS

| | | |
|---|---|---|
| JP | 5-235484 | 9/1993 |
| JP | 8-330635 | 12/1996 |
| JP | 10-261821 | 9/1998 |
| JP | 11-298050 | 10/1999 |
| JP | 11-298050 A | 10/1999 |
| JP | 2004-128424 | 4/2004 |
| JP | 2004-158635 | 6/2004 |
| JP | 2004-158635 A | 6/2004 |
| JP | 2004-259958 | 9/2004 |
| JP | 2004-259958 A | 9/2004 |
| WO | WO 2004/032235 | 4/2004 |

* cited by examiner

*Primary Examiner* — Hung Vu
(74) *Attorney, Agent, or Firm* — Saliwanchik, Lloyd & Eisenschenk

(57) ABSTRACT

There are provided a light emitting device package and a method for manufacturing the same. The light emitting device includes: a plurality of barriers provided above a metal circuit board; a plurality of light emitting devices placed in a space between the barriers; and a lens unit provided at an upper side of the barrier. Accordingly, the plurality of light emitting devices can be conveniently seated as a module format, and a luminance can be increased. Also, an efficiency of heat sink can be increased.

36 Claims, 4 Drawing Sheets

PACKAGE FOR LIGHT EMITTING DEVICE HAVING A LENS SPACED FROM A LIGHT EMITTING DEVICE MODULE

CROSS-REFERENCE TO RELATED APPLICATION

This application is the U.S. national stage application of International Patent Application No. PCT/KR2004/003565, filed Dec. 31, 2004, the disclosure of which is hereby incorporated by reference in its entirety, including all figures, tables and amino acid or nucleic acid sequences.

TECHNICAL FIELD

The present invention relates to a light emitting device package and a packaging method, and more particularly, to a light emitting device package and a packaging method in which at least one high-power light emitting device is packaged and mounted to allow a high luminance, facilitate a heat sink, and improve a freedom degree of a circuit design.

BACKGROUND ART

Generally, a light emitting diode is a typical light emitting device. The light emitting diode refers to a light emitting device for emitting excess energy as light when electrons and holes are recombined. The light emitting diode is being widely used in various fields such as a numeral/character displaying element, a signal light, a light source for a photo coupler and a display device.

Further, the following four conditions should be satisfied to manufacture the light emitting device in good quality. A first condition is a good luminance, a second condition is a long lifetime, a third condition is a thermal stability, and a fourth condition is a low voltage operation.

Among them, the luminance has a close relation to a consumption power. A variety of methods are being developed to currently increase the luminance of the light emitting diode.

Meanwhile, according to the trend of miniaturization and slimness of an information communication apparatus, a variety of parts of the apparatus such as a resistor, a condenser and a noise filter are being more miniaturized. Together with this, many attempts are being made to directly mount the light emitting device with a volume reduced, on the circuit board in a package format.

A related-art light emitting device package is described as an example.

In a structure of the related-art light emitting device package, an electrode lead frame is disposed at a body of the light emitting device package to apply a power source to a light emitting device from an external Printed Circuit Board (PCB).

A mold lens is attached to an upper portion of the package body to improve a luminous efficiency of an emission light of the light emitting device. Additionally, an assembly having the mounted light emitting device is engaged with a lower portion of the package body as below. First, a reflection cup having a high rate of light reflection is engaged to an upper portion of a conductor, and the light emitting device is mounted on a sub mount, which is formed of silicon, by a flip chip bonding or a wire bonding. After that, the sub mount is etched to provide a reflection groove part, and a reflection layer is formed on the reflection groove part. After that, the light emitting device is mounted.

However, the related-art package has a disadvantage in that a plurality of light emitting devices cannot be placed in a single package and a manufacture process is complex.

Another related-art light emitting device package is described.

A circuit board having the light emitting device package and a conductive wire is placed at an internal and lower side of a frame. The light emitting device package is panel-shaped. Additionally, an epoxy-molding layer is provided within the frame to disperse a light of the light emitting device package, and a diffusion plate is adhered to an upper portion of the frame. At this time, the diffusion plate and the light emitting device should be spaced apart from each other to increase a luminance. As such, the diffusion plate and the light emitting device package should be spaced apart and maintained at five or more millimeter. Therefore, the related-art light emitting device package has a drawback in that it is difficult to achieve lightweight, slimness and simplification of a panel.

The above-described related-art light emitting device package has a drawback in that in case where a magnitude of current is increased to obtain a high-power light, a high heat is generated due to a bad performance of a heat sink. Additionally, in case where the light emitting device package has the high heat as it is without dissipation, a resistance is much increased to reduce an luminous efficiency. Specifically, the related-art light emitting device package has a disadvantage in that since the conductor, the reflection cup, the package body and the like are separated from one another, the generated heat of the light emitting device is not easily transmitted to the exterior due to the existence of many thermal resistors.

Further, the related-art light emitting device package has a disadvantage in that since only one light emitting device is installed within the package body, three light emitting device packages should be operated as a set to embody a high-power white light. In this case, there is a disadvantage in that a control circuit is complex and a volume is increased.

Furthermore, since a total board area is increased in a single product type of a multi-combined light emitting device package to connect an electrode with the exterior, an assembly process is increased in cost.

DISCLOSURE

Technical Problem

Accordingly, the present invention is directed to a light emitting device package and a packaging method that substantially obviate one or more of the problems due to limitations and disadvantages of the related art.

An object of the present invention is to provide a light emitting device package in which a plurality of light emitting devices are directly mounted on a metal board to increase an effect of heat sink, thereby reducing a heat-dependent electro-optic phenomenon of a light emitting device, and in which its structure is suitable to arrange a plurality of light emitting devices on a Printed Circuit Board (PCB) with a space limited.

Another object of the present invention is to provide a light emitting device package in which its structure is simplified to allow each of its structural elements to be collectively placed on a metal board, thereby improving an optical function.

A further object of the present invention is to provide a light emitting device package in which even in case where a plurality of the light emitting device packages are effectively arranged and again parallel-constructed to be used as a light source and employed in a liquid crystal display device by using a RGB COB (Chip On Board), an effect of heat sink and an easiness of process are improved.

Technical Solution

To achieve these and other advantages and in accordance with the purpose of the present invention, as embodied and broadly described, there is provided a light emitting device package including: a circuit board; at least one barrier part provided to have a predetermined thickness above the circuit board; at least one light emitting device chip seated at the barrier part, and having a power source applied from the circuit board; a molding part filling an internal space between the barrier parts in a state where the light emitting device chip is housed in the internal space; and a lens unit having at least one lens provided at an upper side of the molding part.

In another aspect of the present invention, there is provided a light emitting device package including: a light emitting device module having: a light emitting device chip comprised of at least one light emitting device, a first barrier for housing the light emitting device chip, and a molding part provided in an internal space between the first barriers; a circuit board having: an electric circuit layer having a circuit electrically connecting with the light emitting device module, an insulating layer provided at a lower surface of the electric circuit layer, and a metal PCB (Metal Core Print Circuit Board) base for dissipating a heat, which is generated from the light emitting device, to the exterior; and a lens unit provided at an upper side of the light emitting device module.

In a further another aspect of the present invention, there is provided a light emitting device package including: a plurality of light emitting devices; a metal circuit board for seating the light emitting device thereat to input and output a power source to and from the light emitting devices; at least one barrier placed outside of the light emitting device and above the metal circuit board; and a lens unit disposed at an upper side of the barrier, for irradiating an emission light of the light emitting device to the exterior.

In a still another aspect of the present invention, there is provided a method of manufacturing a light emitting device package, the method including the steps of: mounting a plurality of light emitting devices above a metal circuit board; providing a barrier above the circuit board; performing a molding process in an internal space between the barriers in which the light emitting device is mounted; and attaching a lens at an upper side of the barrier after the molding process is performed.

Advantageous Effects

The present invention has an advantage in that the plurality of light emitting devices can be mounted in a package format to maximize a luminance and provide an excellent heat sink, and the plurality of light emitting devices are single-packaged and mounted in the package format to simplify a manufacture process.

Further, the present invention has an effect in that the package is reduced in size and thickness and applied to a liquid crystal display device being in a trend of miniaturization to contribute to a slimness of the liquid crystal display device.

BEST MODE FOR CARRYING OUT THE INVENTION

Hereinafter, preferred embodiments of the present invention will be described in detail with reference to accompanying drawings.

First Embodiment

Figure 1:
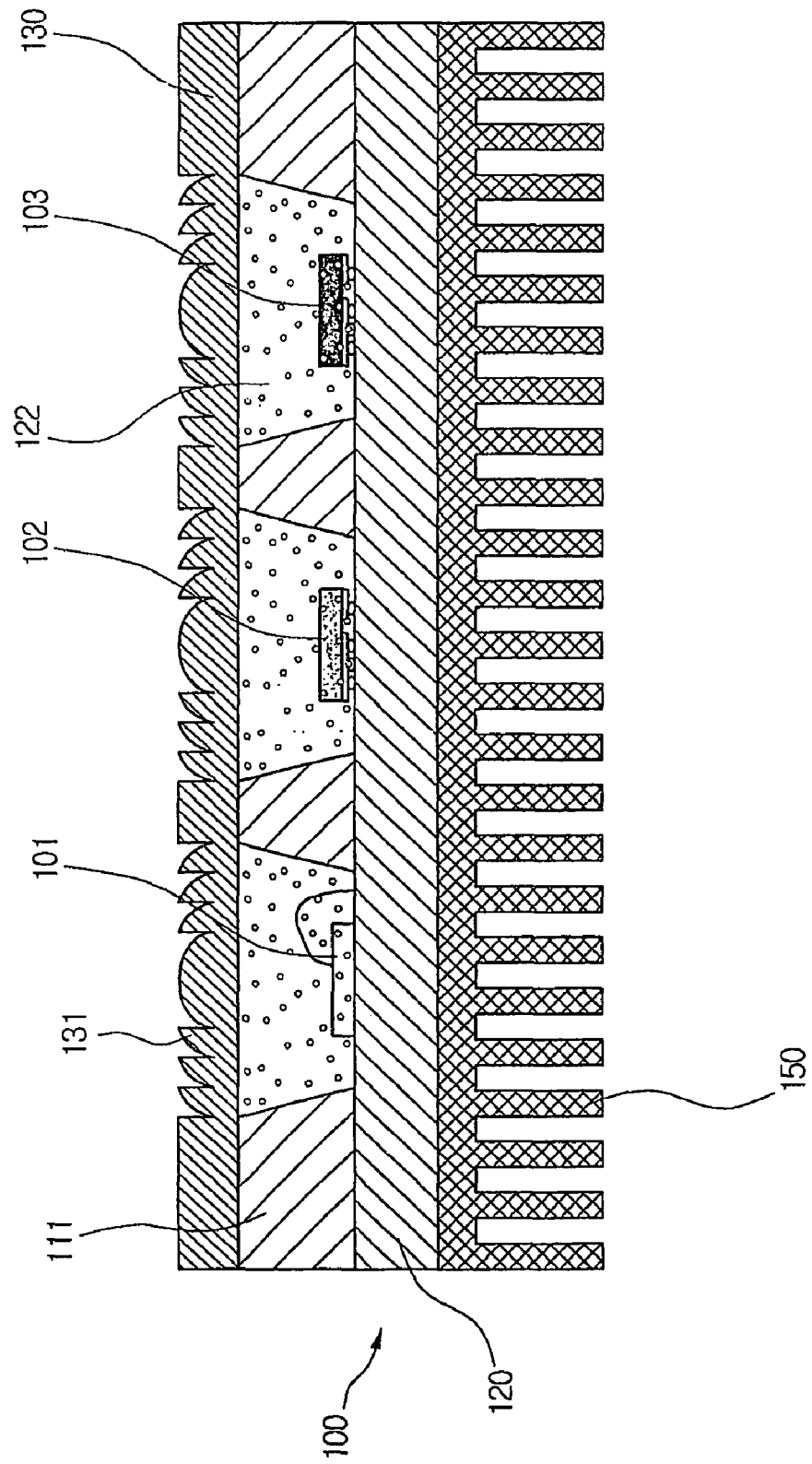
FIG. 1 is a sectional view illustrating a light emitting device package according to a first embodiment of the present invention.

FIG. 1 is a sectional view illustrating a light emitting device package according to a first embodiment of the present invention.

Referring to FIG. 1, the inventive light emitting device package 100 mainly includes light emitting device chips 101, 102 and 103; a lens unit 130; and a circuit board 120.

In detail, the light emitting device chips 101, 102 and 103 have a combined structure of at least one red light-emitting-device chip 101, at least one green light-emitting-device chip 102 and at least one blue light-emitting-device chip 103, which respectively express Red (R), Blue (B) and Green (G). FIG. 1 illustrates a line-arranged shape of three RGB, but the present invention is not limited to the line-arranged shape and can also arrange the RGB to have various shapes of FIGS. 2 to 5.

Further, the lens unit 130 is comprised of a fresnel lenses 131. The fresnel lens 131 has a middle convex-shaped portion, and left and right symmetric portions, which respectively have a concave-convex shape and have the almost same height as the middle convex-shaped portion.

Here, the lens unit 130 can have a structure that a plurality of fresnel lenses are integrated.

The above-constructed fresnel lens has an advantage in that a height can be reduced and the same or more excellent luminance and diffusion can be maintained in comparison with a lens structure caused by a related-art molding.

Further, the circuit board 120 is formed using a metal PCB (Metal Core Printed Circuit Board). The light emitting device chips 101, 102 and 103 are mounted on and a plurality of electrical wirings are provided at the circuit board 120. In other words, though not illustrated in detail, a plurality of wires are formed at the circuit board 120, and the light emitting device chips 101, 102 and 103 are connected to the circuit board 120 by a flip chip or wire bonding. The metal PCB of the circuit board 120 has a large area to mount a plurality of chips, and electrically connects terminals of the mounted chips to apply a current, thereby operating the chips.

Further, since the circuit board 120 is formed of metal, a high heat can be dissipated from the mounted light emitting device chips 101, 102 and 103 to the exterior through the circuit board 120. Therefore, the circuit board 120 is excellent in heat sink. A heat sink plate 150 can be separately additionally attached to or can be integrated with the circuit board 120 in order to increase an effect of heat sink of the circuit board 120. The heat sink plate 150 is concave-convex shaped and has a wide surface area for the heat sink.

Furthermore, a barrier part 111 is provided to improve a luminous efficiency of the light emitting device chips 101, 102 and 103 mounted on the circuit board 120. The barrier part 111 functions to support the lens unit 130 and improve a light emission efficiency of the mounted light device chips 101, 102 and 103. The barrier part 111 is formed of copper (Cu), aluminum (Al), and polycarbonate (PC). A reflection coating film can be formed of argentum (Ag) on an inner surface of the barrier part 111, that is, at a region at which an emission light of the light emitting device chips 101, 102 and 103 is in direct contact with the barrier part 111.

Here, the barrier part 111 can has a structure that a plurality of barriers are integrated.

After the barrier part 111 is fixed to the circuit board 120, a molding part 122 is formed in a space where the light emitting device chips 101, 102 and 103 are placed. The molding part 122 is formed by filling a silicon resin having a predetermined refractive index, so as to protect the light emitting device chips 101, 102 and 103 and the flip chip/wire bonding while maximizing an external quantum efficiency.

As described above, the inventive light emitting device package 100 is provided as one module structure, by assembling the plurality of light emitting device chips 101, 102 and 103; the barrier part 111 disposed around the light emitting device chip; the lens unit 130 comprised of the fresnel lens 131 with a variety of shapes; and the circuit board 120 for mounting the plurality of light emitting device chips to rapidly dissipate the heat, which is caused by a high-power light, to the exterior.

A method of manufacturing the light emitting device package according to the present invention is described below.

The plurality of light emitting device chips 101, 102 and 103 are mounted on the circuit board 120. At this time, the wire bonding rather than the flip chip bonding is suitable to the red light-emitting-device chip 101 due to its red light emission. Therefore, the red light-emitting-device chips 101 are in electric contact with the terminals of the circuit board 120 by the wire bonding.

The green light-emitting-device chips 102 and the blue light-emitting-device chips 103 are in direct contact with the terminals of the circuit board 120 by the flip chip bonding.

After the light emitting device chips 101, 102 and 103 are mounted on the circuit board 120, the barrier part 111 is combined with an upper portion of the circuit board 120 so as to improve a luminous efficiency of the light emitting device and support the lens unit 130.

The barrier part 111 is structured to have an opened region at which the light emitting device chips 101, 102 and 103 are placed.

After the barrier part 111 is combined with the upper portion of the circuit board 120, the resin is injected to form the molding part 122, which functions to mold the light emitting device chips 101, 102 and 103 surrounded by the barriers. At this time, since the high-power light emitting device chips 101, 102 and 103 are mounted, the silicon resin is used as the molding part 122 to prevent degradation and deformation of the molding part 122 and prevent a yellowing phenomenon.

After the light emitting device chips 101, 102 and 103 are molded using the molding part 122, the lens unit 130 having the fresnel lens 131 is combined with the barrier part 111. The lens unit 130 is adhered with the molding part 122 and the barrier part 111 by a constant force. Additionally, when the lens unit 130 is combined with the barrier part 111, the lens unit 130 can be strongly combined to the barrier part 111 by using a heat-resistant adhesive.

After the lens unit 130 is combined to the barrier part 111, a pin (not shown) can be inserted along an edge of the lens unit 130 to wholly engage the light emitting device package 100 with a product while more strongly engaging the lens unit 130 to the barrier part 111.

After the lens unit 130 is combined with an upper portion of the barrier part 111, the concave-convex shaped heat sink plate 150 is attached a lower surface of the circuit board 120 of the light emitting device package 100 so as to dissipate out the generated high heat of the high-power light emitting device chip. As a result of the above process, the light emitting device package 100 is completed.

As described above, the present invention provides one package structure, which is obtained by directly arranging a plurality of the high-power light emitting device chips on the circuit board 120 and then combining the barrier part 111, the lens unit 130 and the heat sink plate 150 with one another.

Specifically, when the plurality of light emitting device chips are embodied as the high-luminance light emitting device package 100, the heat sink plate 150 is additionally attached to rapidly dissipate the high heat, which is caused by a high-power light, outside of the light emitting device package 100.

Further, the molding part 122 or the light emitting device chips 101, 102 and 103 can include at least one kind of phosphor. For example, a yellowish YAG-based or silicate-based phosphor can be added to the blue light-emitting-device chip to emit a white light.

FIGS. 2 to 5 are views illustrating various shapes of the light emitting device package.

Figure 2:
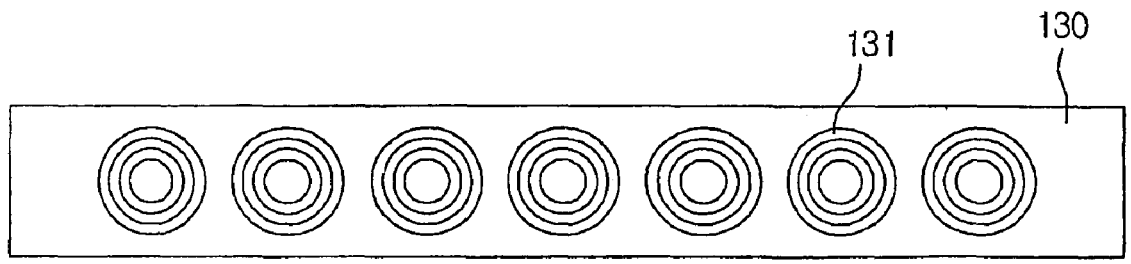
FIGS. 2 to 5 are views illustrating various shapes of a light emitting device package.

Referring to FIG. 2, the lens unit 130 has a low height and is line-shaped. The fresnel lenses 131 are respectively arranged in a line. Of course, the light emitting device chips are respectively disposed at lower sides of the fresnel lenses 131, and are disposed in a line along the barrier part 111 and assembled with the circuit board and the heat sink plate in one module format.

The light emitting device package having the fresnel lenses 131 packaged in the line shape can be used as a backlight of a liquid crystal display device.

Figure 3:
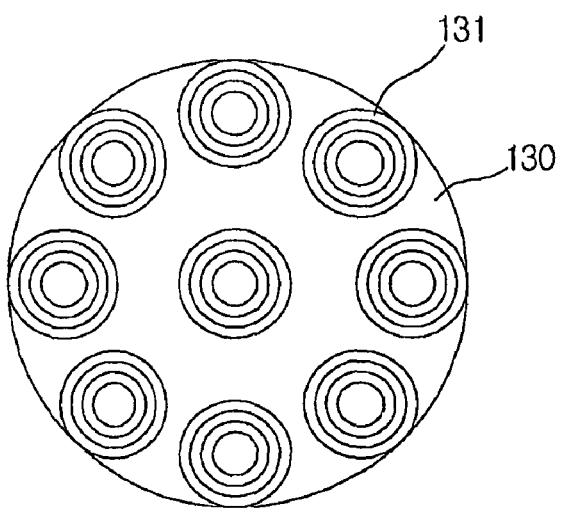

A circular-shaped light emitting device package of FIG. 3 can be used as an illumination of a signal apparatus, a car front light and an indoor illumination light.

Figure 4:
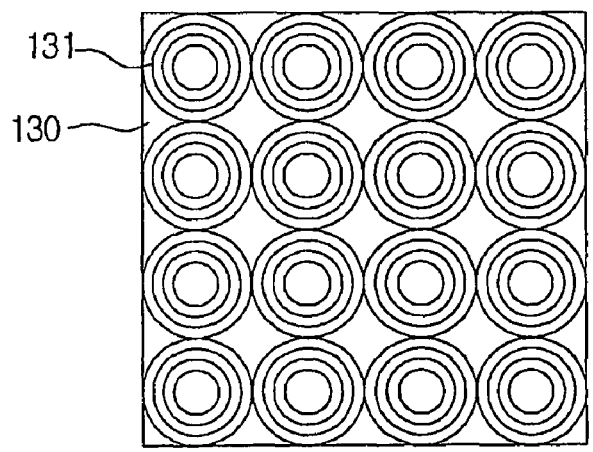
Figure 5:
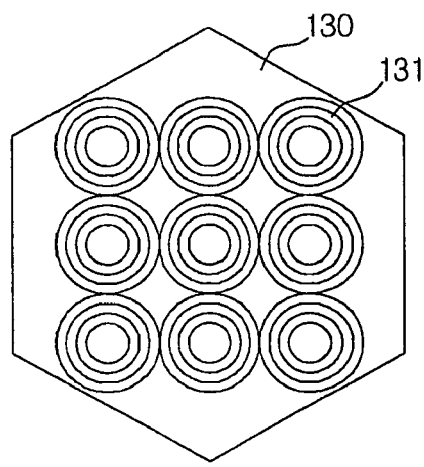

The rectangular or hexagonal-shaped light emitting device package 100 of FIGS. 4 and 5 can be used as various light parts for a daily life, such as an illumination light, an ocean signal light, an emergency light, a stadium illumination light, and a searchlight.

According to the present invention, the high-power light emitting device can be packaged in various patterns, and the light emitting device package can rapidly dissipate the generated high heat of the light emitting device, to the exterior. Therefore, the light emitting device package can be used as a high-luminance light emitting device package module. In addition, since the plurality of light emitting devices are packaged, a manufacture process can be simplified and a cost can be reduced.

Second Embodiment

Figure 6:
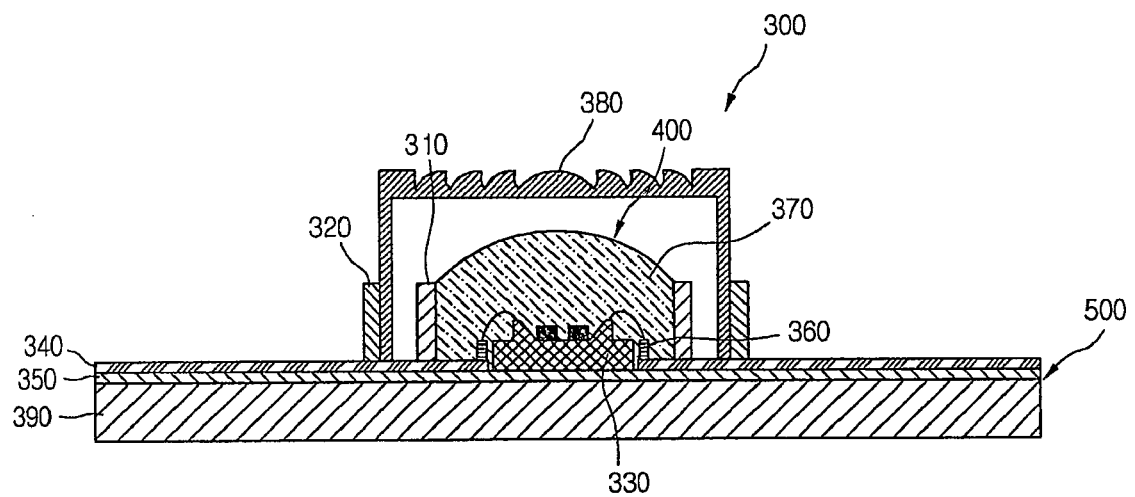
FIG. 6 is a sectional view illustrating a light emitting device package according to a second embodiment of the present invention.

FIG. 6 is a sectional view illustrating a light emitting device package according to a second embodiment of the present invention.

Referring to FIG. 6, the inventive light emitting device package 300 includes a light emitting device module 400; a circuit board part 500, and a lens unit 380.

Additionally, the light emitting device module 400 includes a light emitting device chip 330; first and second barriers 310 and 320; and a molding part 370. The circuit board part 500 includes an electric circuit layer 340; a circuit layer electrode 360; an insulating layer 350; and a metal PCB base 390.

The electric circuit layer 340, the insulating layer 350 and the metal PCB base 390 constitute a metal PCB as a single unit.

The metal PCB base 390 mounts and supports other structural elements such as the electric circuit layer 340 and the insulating layer 350 in its upper direction. The metal PCB base 390 rapidly dissipates the generated heat of the light emitting device chip 330 in its lower direction. For this, the metal PCB base 390 can have a lower layer formed of a high thermal-conductive metal such as aluminum and copper, and can be formed of a compressed semiconductor-based material or be coated with a thermal conductive material to improve a function of thermal dissipation.

A heat sink plate (referring to a reference numeral 150 of FIG. 1) can be additionally combined with a lower surface of the metal PCB base 390. The heat sink plate and the metal PCB base can respectively have a through-hole to allow them to mutually combine with each other in a screw-type connection way.

The insulating layer 350 electrically insulates the electric circuit layer 340 from the metal PCB base 390.

The electric circuit layer 340 is disposed on the insulating layer 350. The inventive light emitting device package 300 includes an individually modularized light emitting device chip 330. A circuit for arranging the light emitting device chip 330 is provided at the electric circuit layer 340. At this time, a plurality of light emitting devices can be together seated in the light emitting device chip 330. For example, three Red, Green and Blue light emitting devices can be seated together.

As described above, in case where the light emitting device chip 330 is provided as a single module where the plurality of light emitting devices are seated on one metal PCB base 390, it is advantageous in design that the electric circuit layer 340 is comprised of a series-connected circuit. Of course, it can be comprised of a parallel-connected circuit depending on an applied voltage.

The circuit layer electrode 360 for electrically conducting with the light emitting device chip 330 is disposed at an end of the electric circuit layer 340. The end is formed by cutting away a portion of the electric circuit layer 340. The light emitting device chip 330 and the circuit layer electrode 360 are wire-bonded with each other.

The circuit layer electrode 360 can be formed in an electroplating way. Further, the circuit layer electrode 360 can be electroplated on its upper surface by using an excellent thermal conductive metal, to improve an electric conductivity. For example, the circuit layer electrode 360 is generally formed of metal such as nickel, and can be electroplated on its upper surface with gold or aluminum. It is effective that the electroplated layer is formed of gold in an electrolytic plating way, to have a thickness of 0.3 μm or more.

As described above, the light emitting device chip 330 has the light emitting device using a compound semiconductor and an electrode (not shown) for transmitting the current to the light emitting device.

Aforementioned above, the light emitting device module 400 is disposed on the insulating layer 350 and the electric circuit layer 340, and is electrically connected with the circuit layer electrode 360. Additionally, when the light emitting device chip 330 is mounted on the metal PCB base 390, it can be firmly seated by an adhesive member such as a thermal conductive curing agent.

Further, the light emitting device chip 330 can be provided as any one of a Silicon Optical Bench (SiOB) chip, a red light-emitting-device chip, a green light-emitting-device chip, a blue light-emitting-device chip, a yellow light-emitting-device chip, and an orange light-emitting-device chip. Specifically, the SiOB chip refers to a chip having the light emitting device mounted in a cup-shaped space obtained by etching a silicon substrate.

The barriers 310 and 320 can be multi-folded to have a ring shape, but they have a two-fold structure in an embodiment of the present invention. The molding part 370 is provided within the first barrier 310 of the two-fold barrier, and the lens unit 380 is combined to the second barrier 320.

Since the barriers 310 and 320 are manufactured in a multi silkscreen way, they can be called as a silkscreen layer. The first barrier 310 can function to support the molding part 370, and the second barrier 320 can function to support the lens unit 380.

In detail, the first barrier 310 houses the light emitting device chip 330 and the molding part 370 for protecting a wire, and functions as a dam not to allow an injected molding liquid to flow outside of the first barrier 310. When the molding part 370 is combined to the first barrier 310, it is convex-shaped to have a lens shape. The molding part 370 can be formed of a synthetic resin such as epoxy or silicon.

The molding part 370, which is a kind of high-refractive filler, uniformly disperses the emission light of the light emitting device chip 330. The molding part 370 is elevated at its middle portion to be convex-shaped in an upper direction, due to a surface tension caused by an upper end of the first barrier 310.

Additionally, the second barrier 320 functions to combine the lens unit 380 outside of the molding part 370. The lens unit 380 can be associated with the molding part 370 to minimize an optical loss of the light radiated.

As described above, when the lens unit 380 is combined to the second barrier 320, it can have various shapes such as a concave-shaped lens, a convex-shaped lens, a trapezoid-shaped lens, an inverted pyramid-shaped lens, and a fresnel lens. The lens unit 380 can be adequately selected depending on a desired radiation direction of the light. As shown, in case where the lens unit 380 is the fresnel lens, the second barrier 320 can be disposed a little higher than the first barrier 310.

Further, a space between the lens unit 380 and the molding part 370 is provided in a vacuum environment, to increase the luminance of the light emitting from the light emitting device chip 330.

Meanwhile, the barriers 310 and 320 are manufactured on the metal PCB by using the silkscreen process. If the silkscreen process is once performed on the metal PCB, a silkscreen is coated at a height of about 15 μm. Accordingly, in the embodiment of the present invention, the silkscreen process is repetitively performed at many times (more than about four times) so that the silkscreen has a height of about 50 to 100 μm.

Additionally, the light emitting device module 400 can include at least one kind of phosphor. For example, a yellowish YAG-based or silicate-based phosphor is provided to allow the blue light-emitting-device chip to express the white light. Here, the phosphor is provided at the molding part 370 or the light emitting device chip 330.

Figure 7:
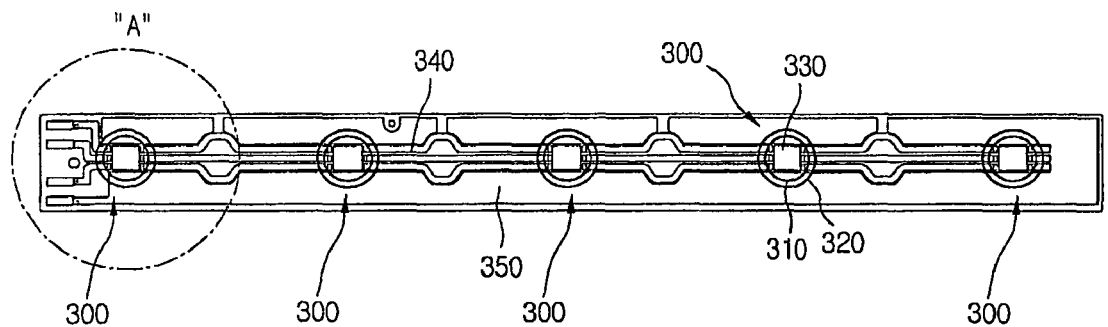
FIG. 7 is a plan view in which light emitting device packages of FIG. 6 are linearly arranged.
Figure 8:
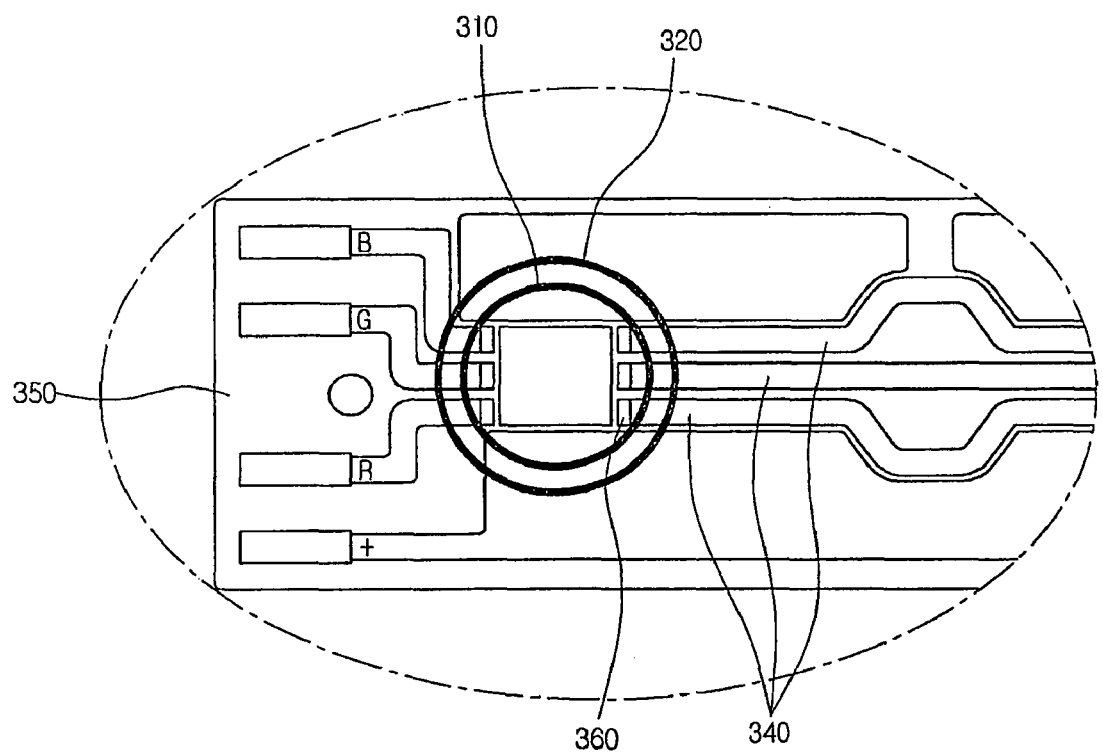
FIG. 8 is an enlarged view of an "A" portion of FIG. 7.

FIG. 7 is a plan view in which the light emitting device packages of FIG. 6 are linearly arranged, and FIG. 8 is an enlarged view of a "A" portion of FIG. 7.

Referring to FIGS. 7 and 8, the light emitting device package 300 is placed in plurality on the metal PCB. Additionally, the electric circuit layer 340 is series-connected with the plurality of light emitting device chips 330 on the metal PCB base 390. Of course, the insulating layer 350 is interposed between the electric circuit layer 340 and the metal PCB base 390 to cut off an electric leakage of the electric circuit layer 340.

As such, the inventive plurality of light emitting device packages 300 are provided to be of a type in which they are placed on a single metal base. Therefore, they can be more adequately used as a part of equipments such as the liquid crystal display device.

Further, in order to allow the light emitting from each of the light emitting device package 300 to the exterior to be again reflected from the metal PCB base 390, it is desirable that the electric circuit layer 340 and the insulating layer 350 have a reflection material or are gloss-coated at their exposed portions.

Here, the light emitting device of the light emitting device chip 330 can be respectively constructed depending on its kind. For example, the light emitting device chips can be constructed for each of red (R), green (G) and blue (B).

As described above, the inventive light emitting device package 300 modularizes a reflection cup, a mold frame, a lead frame, a lens and the like of a related-art light emitting device package, on the metal PCB base. Therefore, the present invention has an advantage in that the package is reduced in size and the arrangement is more freely made, and an individual modularization can be made to improve a heat sink effect.

Further, when the inventive light emitting device package is used as a light source of the liquid crystal display device, it can be employed in a direct-under way or an edge way. Generally, in the direct-under way applied to a display screen having a size of 20 or more inches, the light emitting device module is disposed in front at a rear surface of a diffusion plate. Generally, in the edge way applied to a display screen having a size of 20 or less inches, the light emitting device module is positioned at upper and lower ends of the rear surface of the diffusion plate and a light guide plate is fixed at its middle portion.

INDUSTRIAL APPLICABILITY

As described above, the present invention has an advantage in that the plurality of light emitting devices are packaged and mounted to maximize the luminance, and the heat sink plate is attached to a rear surface of the light emitting device package to provide an excellent heat sink.

Further, the present invention has an advantage in that since the plurality of light emitting device are packaged and mounted as one package, a manufacture process can be simplified.

Furthermore, the present invention has an effect in that the package is reduced in size and thickness and applied to the liquid crystal display device, which is in a trend of miniaturization, thereby contributing to the thinning of the liquid crystal display device.

Additionally, the present invention has an effect in that since the manufacture process can be improved such as the use of the silkscreen to directly mount the individually modularized light-emitting-device package, a material cost can be reduced and a process can be minimized.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. A light emitting apparatus comprising:
   a circuit board comprising an electric circuit layer;
   a light emitting device module on the circuit board, wherein the light emitting device module comprises at least one light emitting device chip and a molding part to protect the at least one light emitting device chip, and wherein the molding part comprises a convex-shaped upper surface; and
   a lens comprising an upper portion and a lower portion connected to and extending from the upper portion, wherein the lower portion contacts the circuit board, wherein the lens is completely spaced from the light emitting device module, forming a space between itself and the light emitting device module, and
   wherein the light emitting device module is completely contained within the lens.

2. The light emitting apparatus according to claim 1, wherein the light emitting device module further comprises a substrate on the circuit board, and wherein the at least one light emitting device chip is disposed on the substrate.

3. The light emitting apparatus according to claim 1, wherein the molding part comprises an epoxy or silicon.

4. The light emitting apparatus according to claim 1, wherein the lens has a dome-shaped upper transmitting surface formed in a substantially central portion thereof, and wherein Fresnel lenses are integrated around the dome-shaped upper transmitting surface.

5. The light emitting apparatus according to claim 1, further comprising a phosphor provided at the molding part.

6. The light emitting apparatus according to claim 5, wherein the at least one light emitting device chip is a blue light emitting device chip and wherein the phosphor is yellowish YAG-based or silicate-based phosphor.

7. The light emitting apparatus according to claim 1, further comprising a phosphor provided at the at least one light emitting device chip.

8. The light emitting apparatus according to claim 7, wherein the at least one light emitting device chip is a blue light emitting device chip and wherein the phosphor is yellowish YAG-based or silicate-based phosphor.

9. The light emitting apparatus according to claim 1, further comprising a reflection material on the circuit board.

10. The light emitting apparatus according to claim 1, further comprising a reflection material on the electric circuit layer.

11. The light emitting apparatus according to claim 1, wherein the light emitting device module comprises at least one of a red light emitting device chip, a green light emitting device chip, a blue light emitting device chip, a yellow light emitting device chip, or an orange light emitting device chip.

12. The light emitting apparatus according to claim 1, further comprising a heat sink plate under the circuit board.

13. The light emitting apparatus according to claim 1, wherein the lens comprises a concave-shaped upper surface.

14. The light emitting apparatus according to claim 1, wherein the space between the lens and the light emitting device module is not filled with other material.

15. The light emitting apparatus according to claim 1, wherein the circuit board comprises a base comprising a metal, an insulating layer on the base, and the electric circuit layer on the insulating layer.

16. The light emitting apparatus according to claim 15, wherein the metal comprises an aluminum or copper.

17. The light emitting apparatus according to claim 15, further comprising a reflection material on the insulating layer.

18. The light emitting apparatus according to claim 1, wherein the circuit board comprises an entire flat upper surface.

19. A light source of a liquid crystal display device comprising:
- a light emitting apparatus; and
- a diffusion plate configured to diffuse light emitted from the light emitting apparatus,
- wherein the light emitting apparatus comprises:
- a circuit board comprising an electric circuit layer;
- a light emitting device module on the circuit board, wherein the light emitting device module comprises at least one light emitting device chip and a molding part to protect the at least one light emitting device chip, and wherein the molding part comprises a convex-shaped upper surface; and
- a lens comprising an upper portion and a lower portion connected to and extending from the upper portion, wherein the lower portion contacts the circuit board,
- wherein the lens is completely spaced from the light emitting device module, forming a space between itself and the light emitting device module, and
- wherein the light emitting device module is completely contained within the lens.

20. The light source of a liquid crystal display device according to claim 19, further comprising a light guide plate adjacent to the light emitting apparatus.

21. The light source of a liquid crystal display device according to claim 19, wherein the light emitting device module further comprises a substrate on the circuit board, and wherein the at least one light emitting device chip is disposed on the substrate.

22. The light source of a liquid crystal display device according to claim 19, further comprising a phosphor provided at the molding part.

23. The light source of a liquid crystal display device according to claim 22, wherein the at least one light emitting device chip is a blue light emitting device chip and wherein the phosphor is yellowish YAG-based or silicate-based phosphor.

24. The light source of a liquid crystal display device according to claim 19, further comprising a phosphor provided at the at least one light emitting device chip.

25. The light source of a liquid crystal display device according to claim 24, wherein the at least one light emitting device chip is a blue light emitting device chip and wherein the phosphor is yellowish YAG-based or silicate-based phosphor.

26. The light source of a liquid crystal display device according to claim 19, further comprising a reflection material on the circuit board.

27. The light source of a liquid crystal display device according to claim 19, further comprising a reflection material on the electric circuit layer.

28. The light source of a liquid crystal display device according to claim 19, wherein the lens comprises a concave-shaped upper surface.

29. The light emitting apparatus according to claim 19, wherein the circuit board comprises an entire flat upper surface.

30. A light emitting apparatus comprising:
- a circuit board comprising an electric circuit layer;
- a light emitting device module on the circuit board, wherein the light emitting device module comprises at least one light emitting device chip and a molding part to protect the at least one light emitting device chip;
- a lens having a hollow structure and containing the light emitting device module; and
- a barrier disposed around the light emitting device module to contact the lens,
- wherein the lens is completely spaced from the light emitting device module, forming a space between itself and the light emitting device module, and
- wherein the circuit board comprises an entire flat upper surface.

31. The light emitting apparatus according to claim 30, wherein the lens has a dome-shaped upper transmitting surface formed in a substantially central portion thereof.

32. The light emitting apparatus according to claim 30, wherein the light emitting device module further comprises a phosphor provided at the at least one light emitting device chip, wherein the phosphor is disposed between the at least one light emitting device chip and the lens.

33. The light emitting apparatus according to claim 32, wherein the at least one light emitting device chip is a blue light emitting device chip and wherein the phosphor is yellowish YAG-based or silicate-based phosphor, and wherein Fresnel lenses are integrated around the dome-shaped upper transmitting surface.

34. The light emitting apparatus according to claim 32, wherein the phosphor is disposed between the at least one light emitting device chip and the molding part.

35. The light emitting apparatus according to claim 30, wherein the lens contacts the circuit board.

36. The light emitting apparatus according to claim 30, wherein the light emitting device module is completely contained within the lens.

* * * * *